(12) United States Patent
Li et al.

(10) Patent No.: US 8,912,844 B2
(45) Date of Patent: Dec. 16, 2014

(54) SEMICONDUCTOR STRUCTURE AND METHOD FOR REDUCING NOISE THEREIN

(71) Applicant: United Microelectronics Corp., Hsin-Chu (TW)

(72) Inventors: Tzung-Lin Li, Hsinchu (TW); Chun-Chang Wu, Changhua County (TW); Chih-Yu Tseng, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 2 days.

(21) Appl. No.: 13/647,392

(22) Filed: Oct. 9, 2012

(65) Prior Publication Data

US 2014/0097890 A1  Apr. 10, 2014

(51) Int. Cl.
*H03K 5/00* (2006.01)
(52) U.S. Cl.
USPC .......................................... 327/558; 327/552
(58) Field of Classification Search
USPC ............................ 327/551–559; 257/595, 533
See application file for complete search history.

(56) References Cited

U.S. PATENT DOCUMENTS

| | | | |
|---|---|---|---|
| 3,150,299 A | 9/1964 | Noyce | |
| 3,256,465 A | 6/1966 | Weissenstem | |
| 3,323,198 A | 6/1967 | Shortes | |
| 3,343,256 A | 9/1967 | Smith | |
| 3,372,070 A | 3/1968 | Zuk | |
| 3,462,650 A | 8/1969 | Hennings | |
| 3,648,131 A | 3/1972 | Stuby | |
| 4,394,712 A | 7/1983 | Anthony | |
| 4,395,302 A | 7/1983 | Courduvelis | |
| 4,616,247 A | 10/1986 | Chang | |
| 4,773,972 A | 9/1988 | Mikkor | |
| 4,939,568 A | 7/1990 | Kato | |
| 5,214,000 A | 5/1993 | Chazan | |
| 5,229,647 A | 7/1993 | Gnadinger | |
| 5,286,926 A | 2/1994 | Kimura | |
| 5,372,969 A | 12/1994 | Moslehi | |
| 5,399,898 A | 3/1995 | Rostoker | |
| 5,463,246 A | 10/1995 | Matsunami | |
| 5,484,073 A | 1/1996 | Erickson | |
| 5,502,333 A | 3/1996 | Bertin | |
| 5,627,106 A | 5/1997 | Hsu | |
| 5,793,115 A | 8/1998 | Zavracky | |
| 5,977,640 A | 11/1999 | Bertin | |
| 6,018,196 A | 1/2000 | Noddin | |
| 6,143,616 A | 11/2000 | Geusic | |

(Continued)

OTHER PUBLICATIONS

Cho et al. (Active Circuit to Through Silicon Via (TSV) Noise Coupling). Tetrahertz Interconnection and Laboratory, 2009 IEEE, pp. 97-100.

(Continued)

*Primary Examiner* — Dinh T. Le
(74) *Attorney, Agent, or Firm* — Winston Hsu; Scott Margo

(57) ABSTRACT

The present invention provides a semiconductor structure, including a substrate, a first TSV, an inductor and a capacitor. The first TSV is disposed in the substrate and has a first signal. The inductor is disposed in the substrate. The capacitor is electrically connected to the inductor to form an LC circuit to bypass the noise from the first signal. The present invention further provides a method of reducing the signal noise in a semiconductor structure.

17 Claims, 7 Drawing Sheets

(56) References Cited

U.S. PATENT DOCUMENTS

| | | |
|---|---|---|
| 6,274,937 B1 | 8/2001 | Ahn |
| 6,309,956 B1 | 10/2001 | Chiang |
| 6,391,777 B1 | 5/2002 | Chen |
| 6,407,002 B1 | 6/2002 | Lin |
| 6,440,640 B1 | 8/2002 | Yang |
| 6,483,147 B1 | 11/2002 | Lin |
| 6,525,419 B1 | 2/2003 | Deeter |
| 6,548,891 B2 | 4/2003 | Mashino |
| 6,551,857 B2 | 4/2003 | Leedy |
| 6,627,985 B2 | 9/2003 | Huppenthal |
| 6,633,083 B2 | 10/2003 | Woo |
| 6,746,936 B1 | 6/2004 | Lee |
| 6,778,275 B2 | 8/2004 | Bowes |
| 6,800,930 B2 | 10/2004 | Jackson |
| 6,812,193 B2 | 11/2004 | Brigham |
| 6,831,013 B2 | 12/2004 | Tsai |
| 6,897,148 B2 | 5/2005 | Halahan |
| 6,924,551 B2 | 8/2005 | Rumer |
| 6,930,048 B1 | 8/2005 | Li |
| 7,034,401 B2 | 4/2006 | Savastiouk |
| 7,052,937 B2 | 5/2006 | Clevenger |
| 7,075,133 B1 | 7/2006 | Padmanabhan |
| 7,098,070 B2 | 8/2006 | Chen |
| 7,111,149 B2 | 9/2006 | Eilert |
| 7,166,913 B2 | 1/2007 | Chinthakindi |
| 7,222,420 B2 | 5/2007 | Moriizumi |
| 7,282,951 B2 | 10/2007 | Huppenthal |
| 7,323,785 B2 | 1/2008 | Uchiyama |
| 7,338,896 B2 | 3/2008 | Vanhaelemeersch |
| 7,402,515 B2 | 7/2008 | Arana |
| 7,432,592 B2 | 10/2008 | Shi |
| 7,531,415 B2 | 5/2009 | Kwok |
| 7,541,677 B2 | 6/2009 | Kawano |
| 7,564,115 B2 | 7/2009 | Chen |
| 7,598,607 B2 | 10/2009 | Chung |
| 7,633,165 B2 | 12/2009 | Hsu |
| 7,732,926 B2 | 6/2010 | Uchiyama |
| 7,795,735 B2 | 9/2010 | Hsu |
| 7,812,426 B2 | 10/2010 | Peng |
| 7,816,227 B2 | 10/2010 | Chen |
| 7,825,024 B2 | 11/2010 | Lin |
| 7,825,517 B2 | 11/2010 | Su |
| 7,843,064 B2 | 11/2010 | Kuo |
| 7,846,837 B2 | 12/2010 | Kuo |
| 7,851,346 B2 | 12/2010 | Lee |
| 7,928,534 B2 | 4/2011 | Hsu |
| 7,932,608 B2 | 4/2011 | Tseng |
| 7,939,941 B2 | 5/2011 | Chiou |
| 7,955,895 B2 | 6/2011 | Yang |
| 7,956,442 B2 | 6/2011 | Hsu |
| 7,969,013 B2 | 6/2011 | Chen |
| 8,026,592 B2 | 9/2011 | Yoon |
| 8,034,708 B2 | 10/2011 | Kuo |
| 8,049,327 B2 | 11/2011 | Kuo |
| 8,053,898 B2 | 11/2011 | Marcoux |
| 8,053,900 B2 | 11/2011 | Yu |
| 8,053,902 B2 | 11/2011 | Chen |
| 8,063,496 B2 | 11/2011 | Cheon |
| 8,362,591 B2 * | 1/2013 | Yen et al. .................. 257/595 |
| 2001/0038972 A1 | 11/2001 | Lyons |
| 2004/0080041 A1 | 4/2004 | Kimura |
| 2004/0188817 A1 | 9/2004 | Hua |
| 2005/0112997 A1 | 5/2005 | Lin |
| 2005/0136635 A1 | 6/2005 | Savastiouk |
| 2005/0205991 A1 | 9/2005 | Chen |
| 2006/0035146 A1 | 2/2006 | Hayashi |
| 2006/0042834 A1 | 3/2006 | Lee |
| 2007/0117348 A1 | 5/2007 | Ramanathan |
| 2007/0126085 A1 | 6/2007 | Kawano |
| 2007/0190692 A1 | 8/2007 | Erturk |
| 2008/0073747 A1 | 3/2008 | Chao |
| 2008/0108193 A1 | 5/2008 | You |
| 2009/0127667 A1 | 5/2009 | Iwata |
| 2009/0134498 A1 | 5/2009 | Ikeda |
| 2009/0180257 A1 | 7/2009 | Park |
| 2009/0224405 A1 | 9/2009 | Chiou |
| 2010/0001379 A1 | 1/2010 | Lee |
| 2010/0140749 A1 | 6/2010 | Kuo |
| 2010/0140772 A1 | 6/2010 | Lin |
| 2010/0153043 A1 * | 6/2010 | Su et al. .................. 702/71 |
| 2010/0244247 A1 | 9/2010 | Chang |
| 2010/0323478 A1 | 12/2010 | Kuo |
| 2011/0084358 A1 | 4/2011 | Kim |
| 2011/0084765 A1 | 4/2011 | Kim |
| 2012/0162947 A1 * | 6/2012 | O'Donnell et al. ......... 361/783 |

OTHER PUBLICATIONS

Kim et al. (High-Frequency Scalable Electrical Model and Analysis a Through SiliconVia (TSV), Feb. 2, 2011 IEEE vol. 1, No. 2, pp. 181-195).

Kim et al. (TSV Modeling and Noise Coupling in 3D IC), Terahertz Interconnection and Package Laboratory, no dated.

* cited by examiner

SEMICONDUCTOR STRUCTURE AND METHOD FOR REDUCING NOISE THEREIN

BACKGROUND OF THE INVENTION

1. Field of the Invention

The present invention relates to a semiconductor structure, and more particularly, to a semiconductor structure that can avoid noise from a high frequency signal.

2. Description of the Prior Art

In modern society, the micro-processor system comprised of integrated circuits (IC) is a ubiquitous device, being utilized in such diverse fields as automatic control electronics, mobile communication devices and personal computers. With the development of technology and the increasingly imaginative applications of electrical products, the IC device is becoming smaller, more delicate and more diversified.

As is well known in the art, an IC device is produced from dies that are fabricated by conventional semiconductor manufacturing processes. The process to manufacture a die starts with a wafer: first, different regions are marked on the wafer; second, conventional semiconductor manufacture processes such as deposition, photolithography, etching or planarization are used to form needed circuit trace(s); then, each region of the wafer is separated to form a die and packaged to form a chip; finally, the chip is attached onto a board, for example, a printed circuit board (PCB), and the chip is electrically coupled to the pins on the PCB. Thus, each of the programs on the chip can be performed.

In order to evaluate the functions and efficiency of the chip and increase the capacitance density to accommodate more IC components in a limited space, many semiconductor package technologies are built up by stacking each die and/or chip, for example, Flip-Chip technology, Multi-chip Package (MCP) technology, Package on Package (PoP) technology and Package in Package (PiP) technology. Besides these technologies, a "Through Silicon Via (TSV)" technique has been well developed in recent years. TSV can improve the interconnections between chips in the package so as to increase the package efficiency.

However, a lot of problems occur when using TSV for transferring signals. For example, due to the larger volume compared to conventional metal interconnection system, it is easy for the signal in the TSV to generate noise toward other electrical circuit, thus affecting the quality of the devices.

SUMMARY OF THE INVENTION

The present invention therefore provides a semiconductor device to solve the above-mentioned problem.

According to one embodiment, a semiconductor structure is provided. The semiconductor structure includes a substrate, a first TSV, an inductor and a capacitor. The first TSV is disposed in the substrate and has a first signal. The inductor is disposed in the substrate. The capacitor is electrically connected to the inductor to form an LC circuit to bypass the noise from the first signal. The present invention further provides a method of reducing the signal noise in a semiconductor structure.

According to another embodiment, a method for reducing noise in a semiconductor structure is provided. A semiconductor structure is provided. It includes a substrate, a first TSV disposed in the substrate, an inductor disposed in the substrate, and a capacitor electrically connects to the inductor to form an LC circuit, wherein the LC circuit has a resonant frequency. Next, supplying a first signal to the first TSV, wherein a frequency of the first signal is substantially equal to the resonant frequency.

By using the TSV as an inductor and connecting it to a capacitor, an LC circuit can be formed and the resonant frequency thereof can match that of the RF signal. Consequently, the noise of the RF signal to other electrical circuit can be reduced and a better quality of devices can be obtained.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
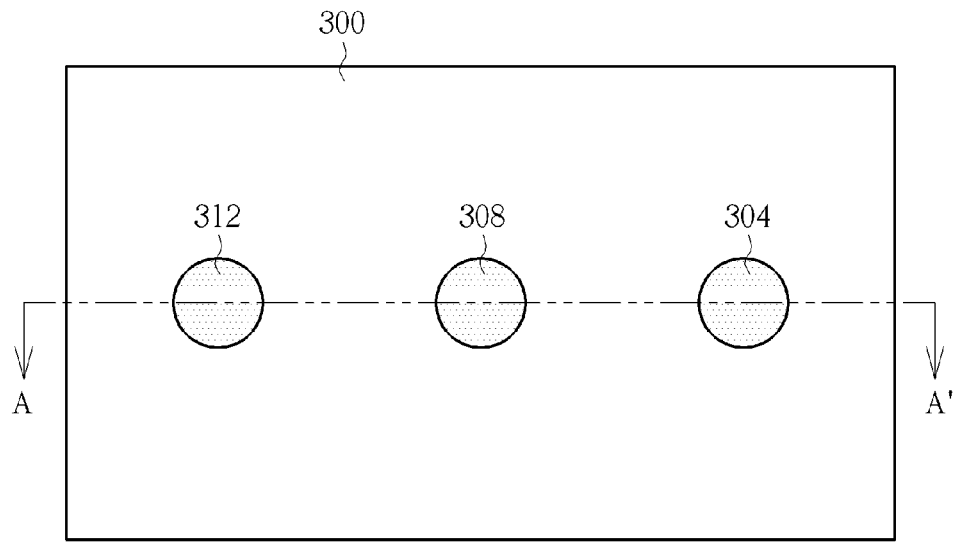
FIG. 1 to FIG. 11 are schematic diagrams of the semiconductor structure in the present invention.
Figure 2:
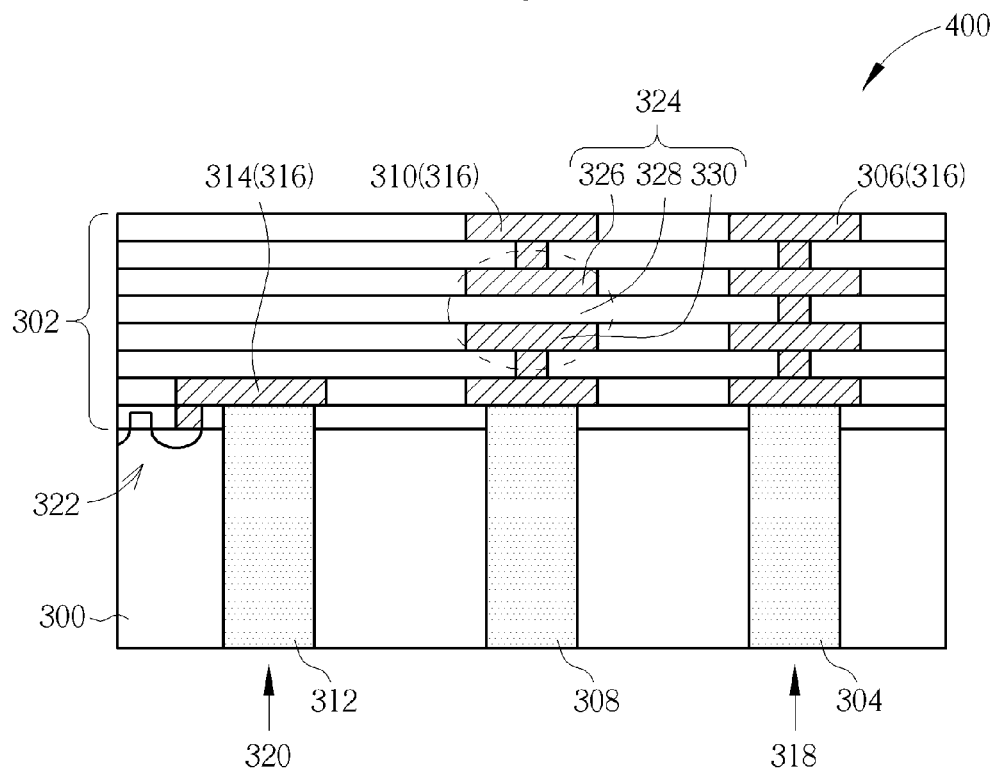
Figure 3:
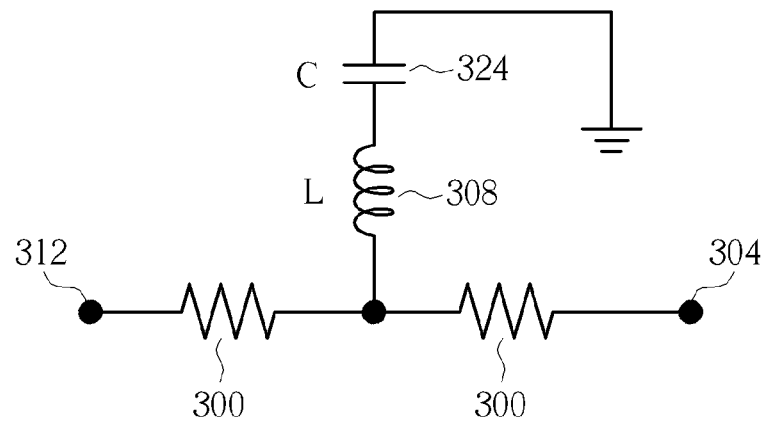

Please refer to FIG. 1, FIG. 2 and FIG. 3, which illustrate schematic diagrams of a semiconductor structure provided in the present invention, wherein FIG. 2 is a cross-sectional view taken along line A-A' in FIG. 1, and FIG. 3 is an equivalent circuit diagram of FIG. 1 and FIG. 2. As shown in FIG. 1 and FIG. 2, the semiconductor structure 400 in the present invention includes a substrate 300 and a plurality of dielectric layers 302 on the substrate 300. The substrate 300 can be a silicon substrate, an epitaxial silicon substrate, a silicon germanium substrate, a silicon carbide substrate or a silicon-on-insulator substrate (SOI substrate). The dielectric layers 302 can be a variety of dielectric materials, such as $SiO_2$, preferably a low-k material, such as hydrogen silsesquioxane (HSQ)(K=2.8), methyl silsesquioxane (MSQ)(K=2.7), HOSP (K=2.5), hydrio polysilsesquioxane (H-PSSQ), methyl polysilsesquioxane (M-PSSQ), phenyl polysilsesquioxane (P-PSSQ) or porous sol-gel, but is not limited thereto.

The semiconductor structure 400 of the present invention further includes a first TSV 304, a second TSV 312 and a third TSV 312, which are disposed in the substrate 300 and penetrate through the substrate 300. In one embodiment, one or more than one of the first TSV 304, the second TSV 308 and the third TSV 312 can further penetrate one or more than one layers of the dielectric layers 302. The first TSV 304, the second TSV 308 and the third TSV 312 include a conductive layer (not shown) and an insulation layer (not shown) between the substrate 300 and the conductive layer. The conductive layer can contain one or more than one metal layer, for example, a metal layer (such as copper) and a barrier layer (such as TiN).

The semiconductor structure 400 in the present invention further contains a metal interconnect system 316 disposed in the dielectric layers 302 and located above at least one of the first TSV 304, the second TSV 308, and the third TSV 312. The metal interconnect system 316 is preferably formed by a conventional metal interconnect manufacturing process, and the material thereof can include silver (Ag), copper (Cu), aluminum (Al), molybdenum (Mo), titanium (Ti), tantalum (Ta) or the nitride thereof, but is not limited thereto. In one embodiment, the metal interconnection system 316 includes a first circuit 306, a second circuit 310 and a third circuit 314, which are electrically connected the first TSV 304, the second TSV 308, and the third TSV 312 respectively.

The first TSV 304 and the first circuit 306 electrically connect a first signal 318. In one preferred embodiment of the present invention, the first signal 318 is a high-frequency (HF) signal, with a frequency higher than 3 MHz. In one embodiment, the first signal 318 is a radio frequency (RF) signal. The third TSV 312 and the third circuit 314 electrically connect a third signal 320, which is an input/output signal for a general electrical device. For example, the third signal 320 can drive the electrical device 322, such as a MOS transistor, by the third circuit 314 and the third TSV 312.

Because the first signal 318 is a high frequency signal, it is easy to generate noise to the neighboring third signal 320, thereby affecting the performance of the electrical component 322. Accordingly, it is one salient feature of the present invention to provide an additional "LC circuit" in the semiconductor structure 400 so as to reduce the noise from the first signal 318. As shown in the equivalent circuit of FIG. 3, the semiconductor structure 400 includes an LC circuit, and its resonant frequency ($f_r$) is obtained by the following formula 1:

$$f_r = \frac{1}{2\pi\sqrt{C \cdot L}} \qquad \text{(formula 1)}$$

wherein C is the capacitance value, and L is the inductance value. By appropriately adjusting the capacitance value and the inductance value, the resonance frequency of the LC circuit can substantially match the frequency of the first signal 318. When the first signal 318 passes the TSV 304 and the first circuit 306, the resonance noise will be absorbed by the LC circuit, thereby reducing the noise for the third TSV 312, the third circuit 314 and the electrical component 322.

About the detail embodiments of the LC circuit, please again refer to FIG. 2. As shown in FIG. 2, the second TSV 308 is used as the inductor L in the LC circuit while a capacitor structure 324 in the second circuit 310 is used as the capacitor C in the LC circuit. In the present embodiment, the capacitor structure 324 includes a first electrode 326, a second electrode 330 and a capacitor dielectric layer 328 disposed therebetween, thus forming a "metal-insulator-metal (MIM)" structure.

Figure 4:
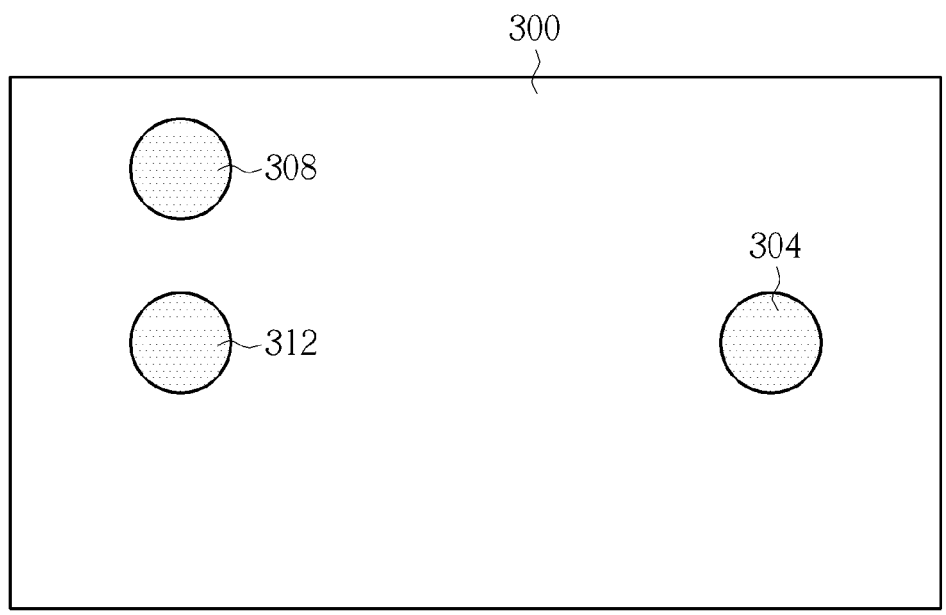

In one embodiment, the relative positions of the first TSV 304, the second TSV 308 and the third TSV 312 in the substrate 300 can be adjusted depending on the design of the products design. As shown in FIG. 4, the second TSV 308 in the present embodiment is not disposed between the first TSV 304 and the third TSV 312 but disposed at the edge or the corner in the substrate 300 of the die or the chip.

Figure 5:
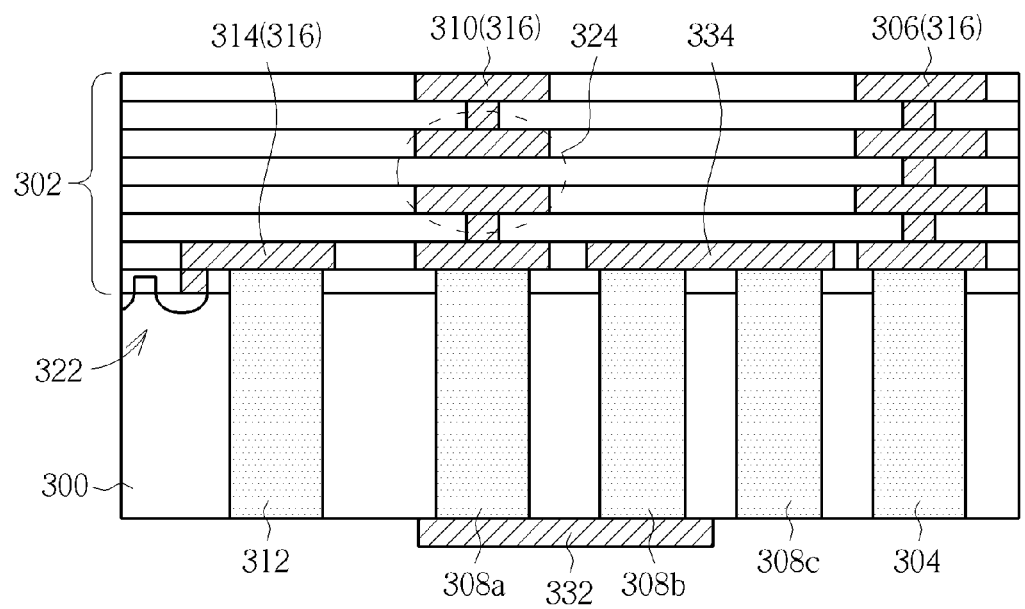

As shown in FIG. 5, in another embodiment of the present invention embodiment, the inductor of the LC circuit may contain a plurality of second TSVs 308, for example, the second TSV 308a, the second TSV 308b and the second TSV 308c. In one preferred embodiment of the present invention, these second TSVs 308 are electrically connected to each other in series. For instance, the second TSV 308a is electrically connected to the second TSV 308b via a connecting line 332, and the second TSV 308b is electrically connected to the second 308c via a connecting line 334. Preferably, the connecting line 332 and the connecting line 334 are located at different sides of the substrate 300. The second TSV 308a is electrically connected to the capacitor structure 324 in the second circuit 310. By connecting the second TSVs 308 in series, the inductance value of the LC circuit can be increased.

Figure 6:
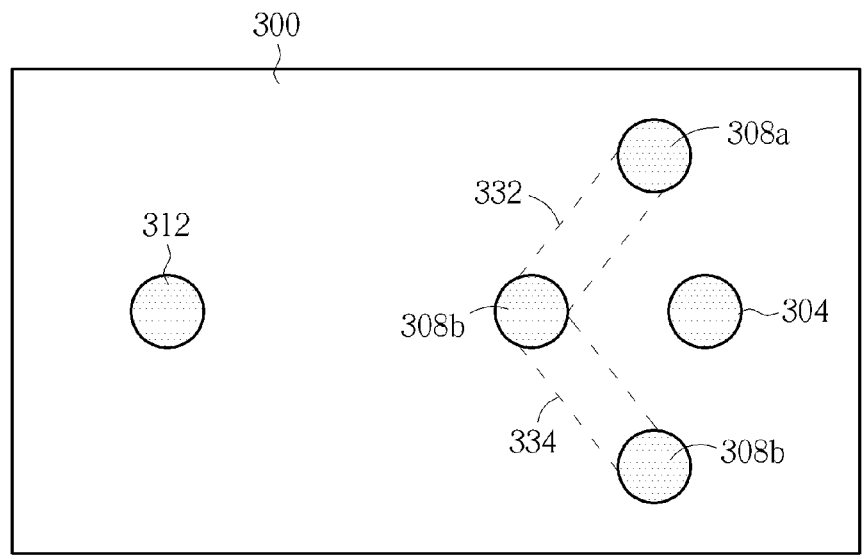

As shown in FIG. 6, when more than one second TSV 308 are provided, the second TSVs 308 can encompass the first TSV 304 so as to provide a better noise inhibition effect. In another embodiment, the second TSVs 308 can also be disposed in other locations, for example, they can encompass the third TSV 312, or they can be disposed at the edge or the corner of the chip or the die.

Figure 7:
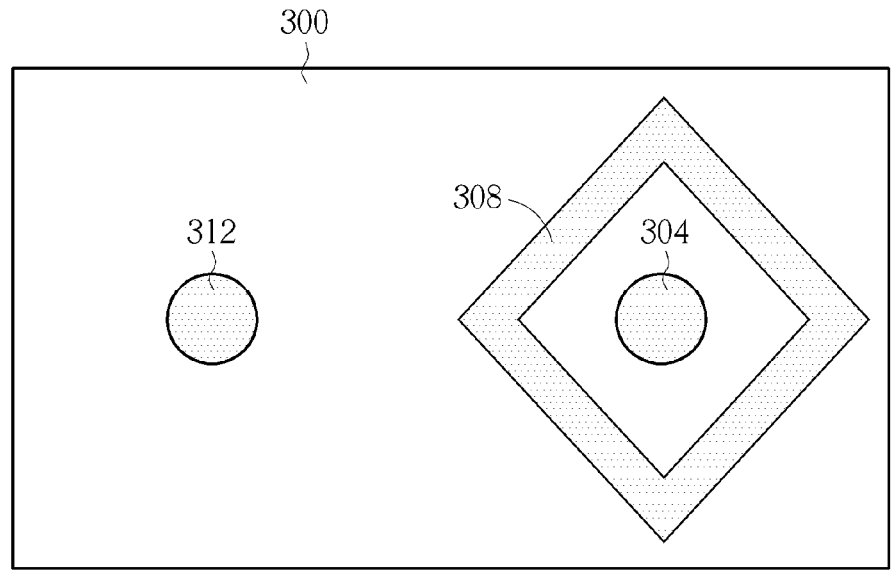

As shown in FIG. 7, in another embodiment of the present invention, the second TSV 308 can have a continuous and closed annular cross section which completely encompasses the first TSV 304. In this manner, the second TSV 308 can provide a shield effect and can also serve as the inductor of the LC circuit. In one embodiment, the cross section of the second TSV 308 can be of any shape, such as circular, rectangular, but is not limited thereto.

Figure 8:
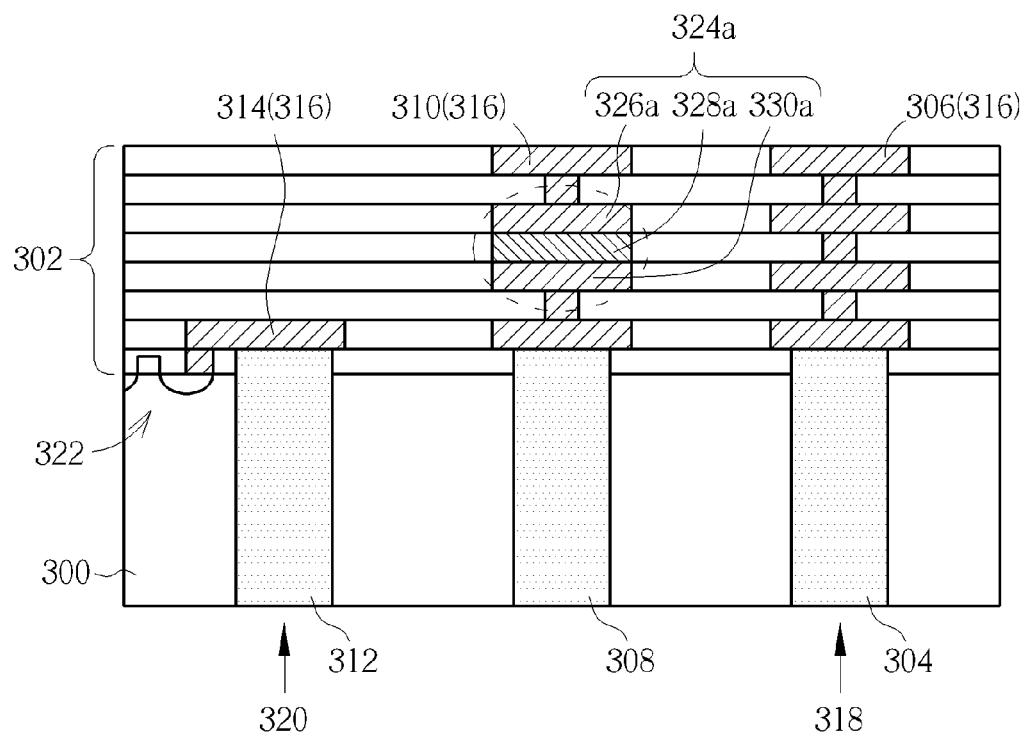

Besides the MIM structure in the metal interconnection system 316 shown in FIG. 2, the capacitor of the LC circuit can also have other embodiments. As shown in FIG. 8, the first electrode 326a and the second electrode 330a of the capacitor structure 324a can include metal such as silver (Ag) copper (Cu), aluminum (Al), molybdenum (Mo), titanium (Ti), tantalum (Ta) or the nitride thereof. The capacitor dielectric layer 328a may be made of different material from that of the dielectric layer 302. For example, the capacitor dielectric layer 328a can be made of a high-k dielectric material, such as hafnium oxide ($HfO_2$), hafnium silicon oxide ($HfSiO_4$), hafnium silicon oxynitride (HfSiON), but is not limited thereto. By using the high-k dielectric material and the metal, the capacitance value of the capacitor structure 324a can be increased.

Figure 9:
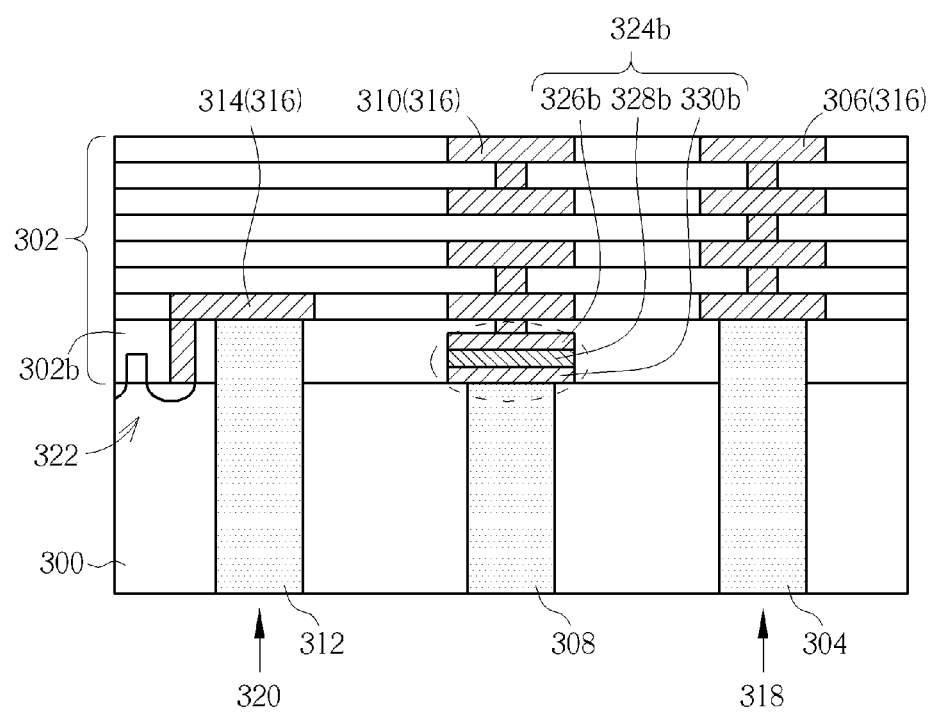

As shown in FIG. 9, the capacitor structure 324b in the present embodiment is disposed in the dielectric layer 302b that is closest to the substrate 300, a so-called inter-layer dielectric layer (ILD layer) 302b. In the present embodiment, the second TSV 308 does not penetrate the dielectric layer 302 and there is no metal interconnection system 316 between the second TSV 308 and the capacitor structure 324b. In other words, the capacitor structure 324b directly contacts the second TSV 308. In the present embodiment, the capacitor structure 324b includes a first electrode 326b, a second electrode 330b, and a capacitor dielectric layer disposed therebetween. In one embodiment, both the first electrode 326b and the second electrode 330b are poly-silicon, while the capacitor dielectric layer 328b is $SiO_2$, thereby forming a "poly-insulation-poly (PIP)" structure. In another embodiment, one of the first electrode 326b and the second electrode 330b is poly-silicon and the other is metal. In the present embodiment, the capacitor structure 324b is fabricated together with the electrical component 322, following by forming the ILD layer 302b covering the capacitor structure 324b and the electrical component 322. Next, the metal interconnection system 316 is formed above the ILD layer 302b.

Figure 10:
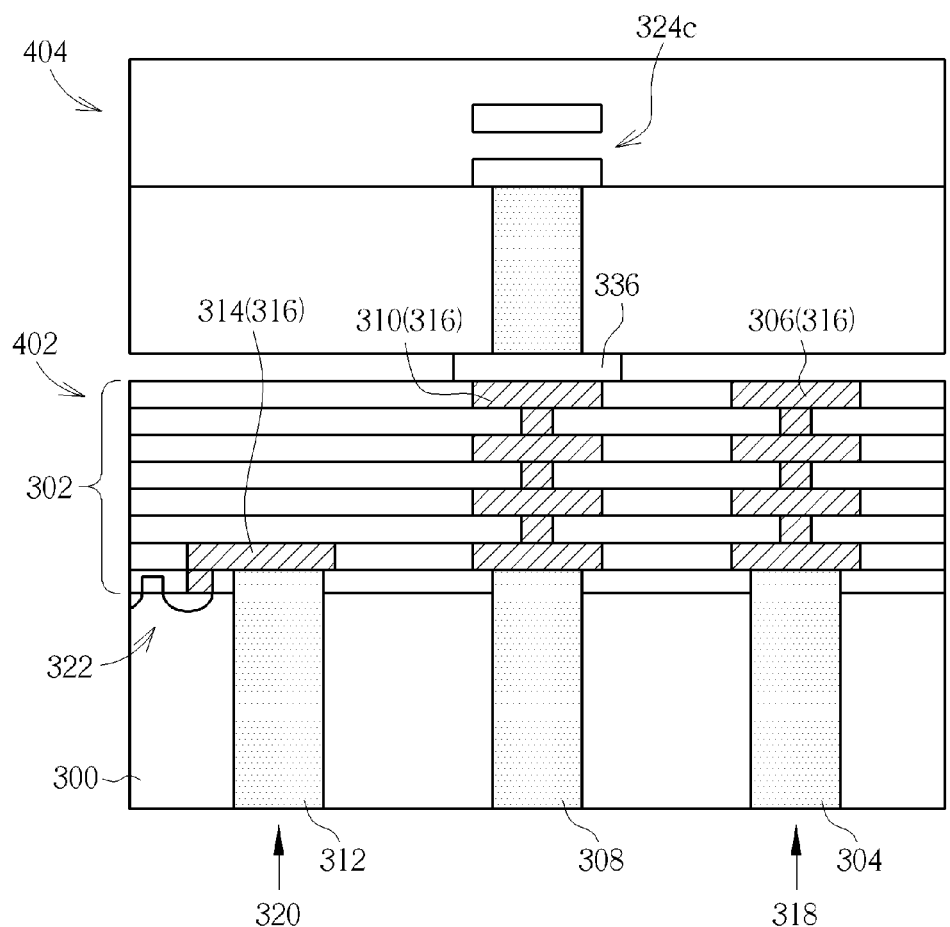
Figure 11:
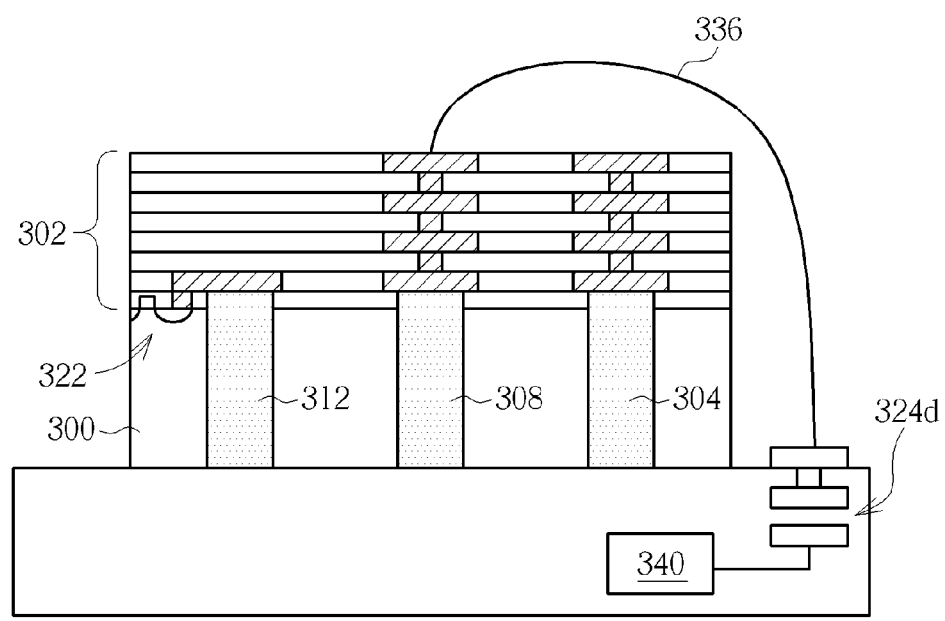

The capacitor structure in the present invention can be located in another chip, and is electrically connected to the second TSV 308 by a connection unit. As shown in FIG. 10, the semiconductor structure in the present embodiment includes at least a first chip 402 and a second chip 404, which are stacked with each other. The first chip 402 is similar to the structure in FIG. 2. As shown in FIG. 10, the capacitor structure 324c in the present embodiment is disposed in the second chip 404 while the second TSV 308 is disposed in the first chip 402. The capacitor structure 324c is connected to the second circuit 310 of the first chip 402 by a connection unit 336. In one embodiment, the connection unit 336 can be a solder bump or a redistribution layer (RLD). Alternatively, as shown in FIG. 11, the connection unit 336 can be a wire bonding. In another embodiment, the stacked chips can have different embodiments in accordance with the different package technologies. For example, in one embodiment, the second chip 402 can be a print circuit board (PCB) or a Si interposer, and the capacitor structure can be a discrete component on a PCB.

In another embodiment of the present invention, as shown in FIG. 11, the capacitor structure 324d can further connect to a voltage providing unit 340. By applying appropriate voltage from the voltage providing unit 340, the capacitance value of the capacitor structure 324d can be adjusted, so that the frequency of the LC circuit can ideally match the frequency of the first signal 318.

It is worth noting that the aforementioned embodiments of the capacitor structure can be arbitrarily integrated with the embodiments of the inductor. For example, the embodiment that the second TSVs in series in FIG. 5 can be integrated with the capacitor structure 324c which is located in another chip as shown in FIG. 10. Alternatively, the capacitor structure 324c can further connect a voltage supply unit 340 as show in FIG. 11. Alternatively, the inductor connected in series as shown in FIG. 5 can be disposed in another chip or can be a discrete component in a PCB. The capacitor structure 324 of the present invention is not limited to the above-mentioned embodiments, for example, the capacitor structure 324 may be a crown capacitor or a deep trench capacitor. Furthermore, the capacitor structures and/or the inductors can be electrically connected to each other either in series or in parallel, which should also belong to the scope of the present invention.

According to the features of the present invention, a method of using a TSV and a capacitor structure to block a high frequency is further provided. As shown in FIG. 2, a semiconductor structure 400 is provided. The semiconductor structure 400 includes a substrate 300 and a plurality of layers of dielectric layer 302 disposed on the substrate 300. A first TSV 304 and a second TSV 308 are disposed in the substrate 300. A first circuit 306 and a capacitor structure 324 are disposed in the dielectric layers 302. The first TSV 304 connects the first circuit 306. The second TSV 308 connects the capacitor structure 324 to form an LC circuit which a resonant frequency. Next, a first signal 318 is supplied to the first TSV 304 and the first circuit 306, wherein a frequency of the first signal 318 is substantially equal to the resonant frequency.

In summary, the present invention provides a semiconductor structure and a method for reducing the noise in the semiconductor structure. By using the TSV as an inductor and connecting it to a capacitor, an LC circuit can be formed and the resonant frequency thereof can match that of the RF signal. Consequently, the noise of the RF signal to other electrical circuit can be reduced and a better quality of devices can be obtained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a substrate;
a first silicon through via (TSV) disposed in the substrate, wherein the first TSV is used to transfer a first signal;
an inductor structure comprising a second silicon through via (TSV) and disposed in the substrate;
a capacitor structure electrically connected to the inductor structure, wherein the capacitor structure comprises a first electrode, a second electrode and a capacitor dielectric layer disposed therebetween, and the capacitor structure and the inductor structure form an LC circuit to reduce noise from the first signal; and wherein the inductor structure and the capacitor structure are placed in parallel with the first silicon through via.

2. The semiconductor structure according to claim 1, wherein a frequency of the first signal is substantially equal to a resonant frequency of the LC circuit.

3. The semiconductor structure according to claim 1, wherein the first signal is a RF signal.

4. The semiconductor structure according to claim 1, wherein the second TSV has a continuous and closed cross-section which completely encompasses the first TSV.

5. The semiconductor structure according to claim 1, wherein the second TSV is disposed at the edge of the substrate.

6. The semiconductor structure according to claim 1, wherein the inductor comprises a plurality of second TSVs disposed in the substrate.

7. The semiconductor structure according to claim 6, wherein the second TSVs are connected to each other in series.

8. The semiconductor structure according to claim 6, wherein the second TSVs encompass the first TSV.

9. The semiconductor structure according to claim 1, further comprising a plurality of dielectric layers disposed on the substrate, wherein the capacitor structure is disposed in the dielectric layers.

10. The semiconductor structure according to claim 1, wherein the first electrode and the second electrode comprise metal.

11. The semiconductor structure according to claim 1, wherein at least one of the first electrode and the second electrode comprises poly-silicon.

12. The semiconductor structure according to claim 1, wherein the inductor structure is disposed in a first chip, and the semiconductor structure further comprises a second chip, the capacitor structure is disposed in the second chip and electrically connected to the inductor structure by a connection unit.

13. The semiconductor structure according to claim 12, wherein the connection unit comprises a solder bump, a redistribution layer or a wiring bonding.

14. The semiconductor structure according to claim 1, wherein the capacitor structure further connects a voltage providing unit.

15. A method for reducing noise in a semiconductor structure, comprising:
providing a semiconductor structure, comprising:
a substrate;
a first through silicon via (TSV) disposed in the substrate;
an inductor structure comprising a second silicon through via (TSV) and disposed in the substrate; and
a capacitor structure electrically connected to the inductor to form an LC circuit, wherein the LC circuit has a resonant frequency and the capacitor structure comprises a first electrode, a second electrode and a capacitor dielectric layer disposed therebetween; and
wherein the inductor structure and the capacitor structure are placed in parallel with the first silicon through via; and
supplying a first signal to the first TSV, wherein a frequency of the first signal is substantially equal to the resonant frequency.

16. The method for reducing noise in the semiconductor structure according to claim 15, wherein the inductor comprises a plurality of second TSVs disposed in the substrate and the second TSVs are connected to each other in series.

17. The method for reducing noise in the semiconductor structure according to claim 15, wherein the semiconductor structure further comprises a plurality of dielectric layers disposed on the substrate, and the capacitor structure is disposed in the dielectric layers.

* * * * *